Nov. 21, 1967 TETSURO NAKAMURA 3,354,364

DISCONTINUOUS RESISTANCE SEMICONDUCTOR DEVICE

Filed July 8, 1964 4 Sheets-Sheet 1

INVENTOR
TETSURO NAKAMURA
BY
Hopgood & Calimafde
ATTORNEYS

INVENTOR
TETSURO NAKAMURA
BY
Hopgood & Calimafde
ATTORNEYS

DISCONTINUOUS RESISTANCE SEMICONDUCTOR DEVICE

Filed July 8, 1964 4 Sheets-Sheet 3

INVENTOR
TETSURO NAKAMURA
BY
Hopgood & Calimafde
ATTORNEYS

INVENTOR
TETSURO NAKAMURA
BY
Hopgood & Calimafde
ATTORNEYS

United States Patent Office 3,354,364

Patented Nov. 21, 1967

3,354,364

DISCONTINUOUS RESISTANCE SEMICONDUCTOR DEVICE

Tetsuro Nakamura, Tokyo, Japan, assignor to Nippon Electric Company, Limited, Tokyo, Japan, a corporation of Japan Filed July 8, 1964, Ser. No. 381,097
Claims priority, application Japan, Aug. 22, 1963, 38/44,659
2 Claims. (Cl. 317—235)

This invention relates to a semiconductor device, and in particular to a single crystal semiconductor having predetermined resistance discontinuities.

PNPN, Zener and ordinary diodes are examples of semiconductor devices, the resistance gradient of which is discontinuous at ascertainable terminal voltages and currents. In these devices, however, the resistance variation particularly near certain terminal voltages, and the effect upon the resistance by a change in terminal polarity makes the device characteristically unsuitable for application similar to those allocated wound or sliding resistors.

Heretofore it has been, as a practical matter, almost impossible to obtain a semiconductor device with linear resistance characteristics between discontinuities in conjunction with Zener breakdown characteristics.

Accordingly, it is the object of this invention to provide a semiconductor device which has the combined characteristics of a wound resistor and a Zener diode.

It is a further object of this invention to provide a semiconductor device which has a predetermined variable resistance characteristic in conjunction with Zener characteristics.

It is a further object of this invention to provide a semiconductor device which has substantially linear resistance characteristics, varying between predetermined discontinuities.

And it is a still further object of this invention to provide the aforementioned characteristics either symmetrically or asymmetrically with respect to the terminal polarities.

Briefly, the invention is predicated upon one or more novel U-shaped cross-section pn junctions having a semiconductor of a first type within the interior of the U, a semiconductor of the second type embracing the periphery of the U, and a pair of terminals affixed to said second semiconductor type and disposed on either side of said U-shaped junction.

The above mentioned and other features and objects of this invention and the manner of attaining them will become more apparent and the invention itself will best be understood by reference to the following description of embodiments of the invention taken in conjunction with the accompanying drawings wherein:

FIGS. 1(*a*) through 1(*h*) are cross-sectional, plan, and front elevation views of the sequential steps in producing the semiconductor device according to the invention. In these figures, as well as in those following, the prime (′) designation indicates the plan view.

FIGS. 2(*a*) through 2(*g*) are cross-sectional, plan, and front elevation views of the sequential steps in producing a surface stabilized semiconductor device according to FIG. 1.

Figure 1A:
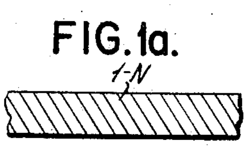
Figure 1B:
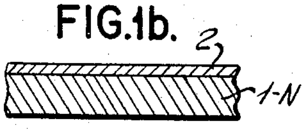
Figure 1C:
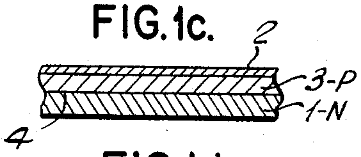
Figure 1D:
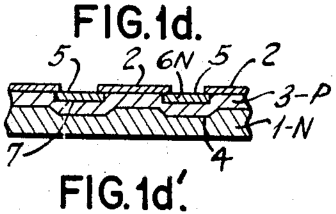
Figure 1D:
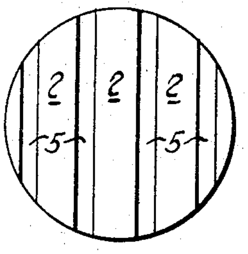
Figure 1E:
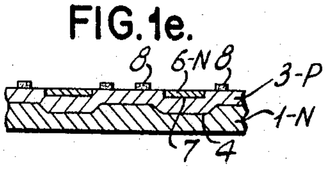
Figure 1E:
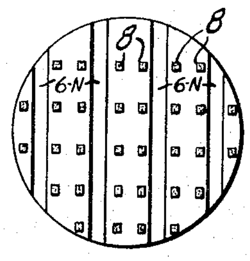
Figure 1F:
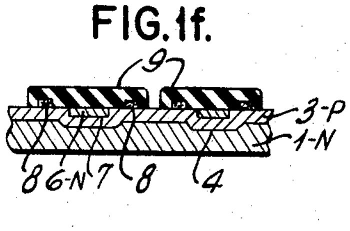
Figure 1F:
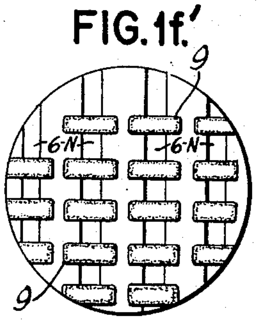
Figure 1G:
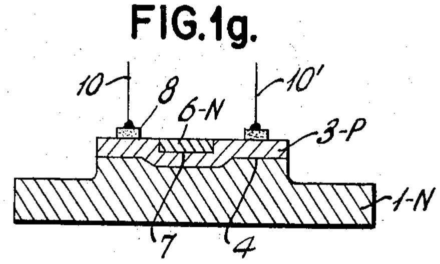
Figure 1H:
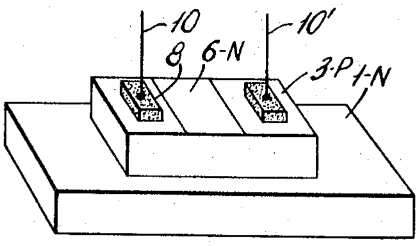
Figure 2A:
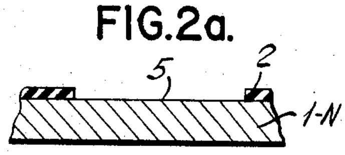
Figure 2A:
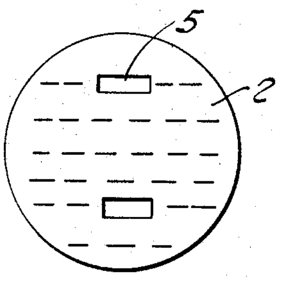
Figure 2B:
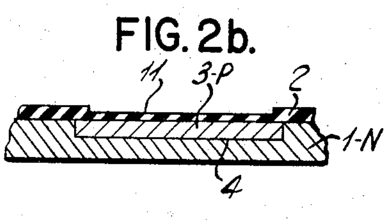
Figure 2C:
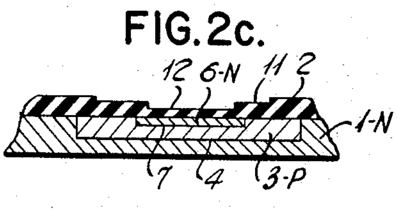
Figure 2C:
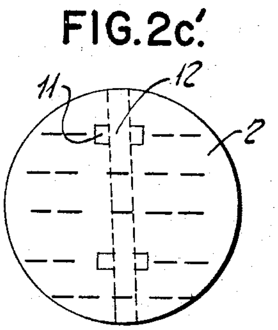
Figure 2D:
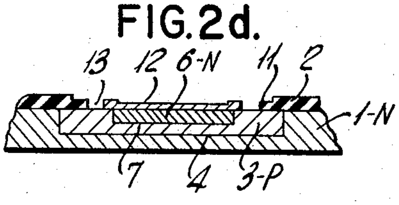
Figure 2E:
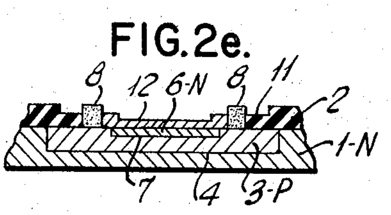
Figure 2E:
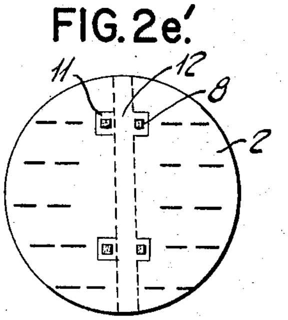
Figure 2F:
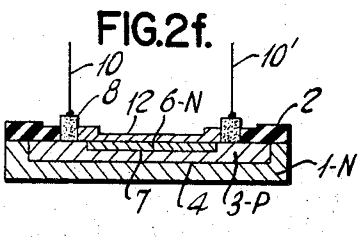
Figure 2G:
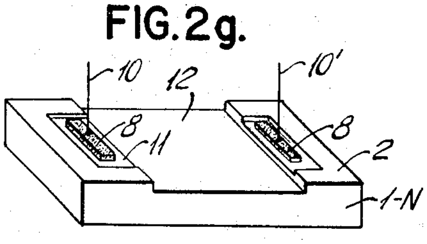
Figure 3A:
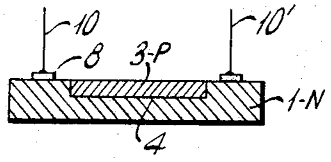
Figure 3B:
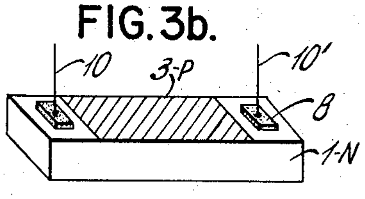

FIGS. 3(*a*) and 3(*b*) are cross-sectional and front elevation views, respectively, of a second embodiment of the semiconductor device according to the invention.

Figure 4A:
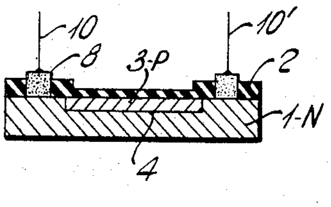
Figure 4B:
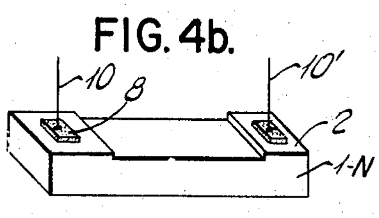

FIGS. 4(*a*) and 4(*b*) are cross-sectional and front elevation views, respectively, of a surface stabilized embodiment of the device of FIG. 3.

Figure 5:
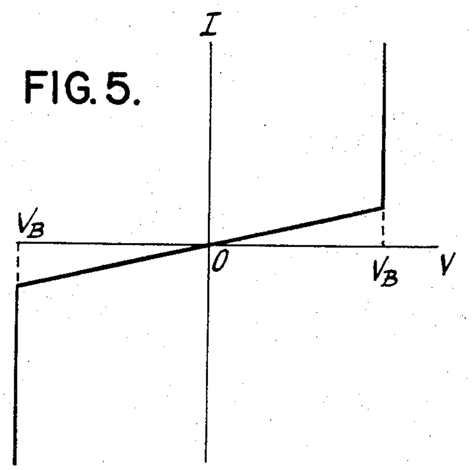

FIG. 5 is a graphic representation of the V–I characteristics of the embodiment of FIGS. 1 and 2.

Figure 6A:
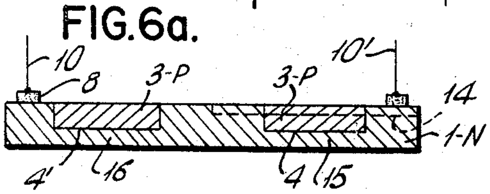
Figure 6B:
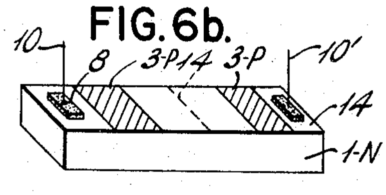

FIGS. 6(*a*) and 6(*b*) are cross-sectional and front elevation views, respectively, of a third embodiment of the semiconductor device according to the invention.

Figure 7:
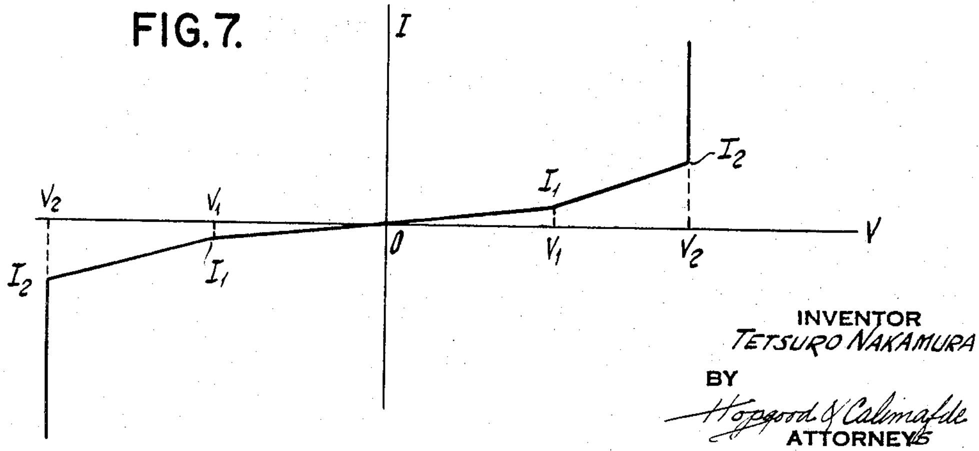

FIG. 7 is a graphic representation of the V–I characteristics of the embodiment of FIG. 6.

Figure 8A:
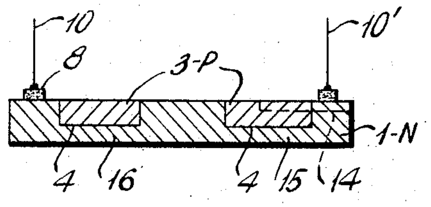
Figure 8B:
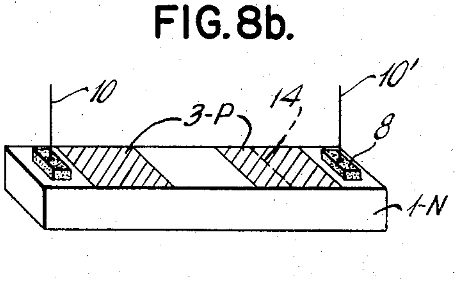
Figure 9:
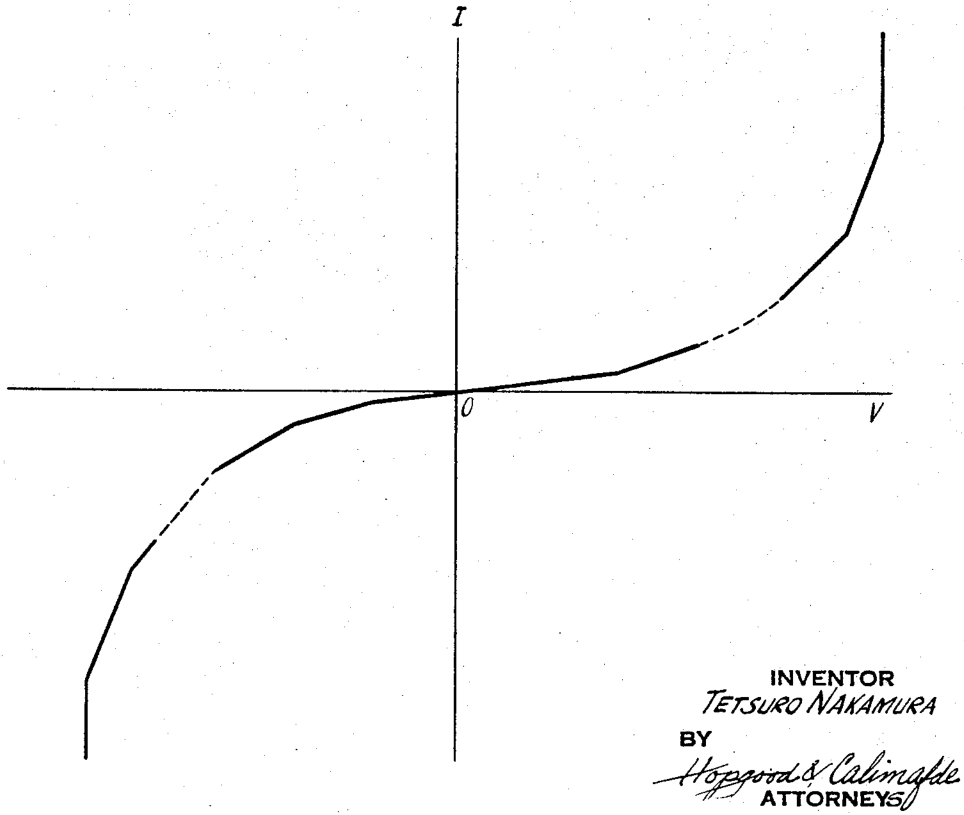

FIGS. 8(*a*) and 8(*b*) are cross-sectional and front elevation views, respectively, of a fourth embodiment of the semiconductor device according to the invention; and FIG. 9 is a graphic representation of the V–I characteristics of the embodiment of FIG. 8.

Turning now to the figures and in particular with reference to FIGS. 1(*a*) through 1(*h*), the sequential steps in producing the semiconductor device according to the invention will be described. FIG. 1(*a*) shows an n-type silicon wafer, mirror polished on one surface. The wafer is oxidized at a high temperature and an oxide layer 2 is grown as shown in FIG. 1(*b*) to a thickness of 1 micron. Gallium (Ga) is then diffused through the oxide layer 2 forming a diffused layer 3 and a pn junction 4 within the crystal, as shown in FIG. 1(*c*). The oxide layer may be grown on all sides of the silicon wafer and the Ga diffused over the whole periphery; however, for simplicity only the upper surface is shown in the figure. Portions 5 of the oxide layer 2 are then removed by photoengraving as shown in FIGS. 1(*d*) and 1(*d′*), a cross sectional view and a plan view, respectively, and phosphorous is diffused into the silicon; the surface concentration of the phosphorous diffused layer being higher than that of the gallium diffused layer, forming n-type diffused layers 6 and pn junctions 7. The oxide layer is then removed completely and aluminum terminal contacts 8 are deposited by vacuum evaporation, as shown in the cross sectional view of FIG. 1(*e*), and the plan view of FIG. 1(*e′*). Subequently, Apiezon wax 9 is applied on the surface of the crystal, where protection is needed, as shown in FIGS. 1(*b*) and 1(*b′*), and the non-protected portions removed by chemical treatment, leaving a mesa structure. The wafer is then divided into individual devices by scribing, and lead wires 10 and 10′ are attached to the contacts 8 as shown in the views of FIG. 1(*g*) and FIG. 1(*h*).

Although FIGS. 1(*g*) and 1(*h*) show only a single device, it will be appreciated that a plurality of such devices is formed on one wafer. Further, and this will hold equally true for the embodiments to be described, while specific procedural steps have been delineated in the foregoing (e.g. scribing, vacuum evaporation etc.) these are by way of example only; it being apparent that numerous equivalents are available to one skilled in the art.

In the above embodiment n-type silicon with 3 ohm-cm. resistivity was used as the wafer 1; the surface concentration of gallium was $6\times10^{18}$ atoms/cm.$^3$; the distance between the junctions 4 and 7 was 1.7 microns; and the depth of the junction 4 was 5 microns. The resulting resistivity achieved between the junctions 4 and 7 was $1.6\times10^3$ ohms.

The voltage-current characteristic at the external terminals 10 and 10′ is as shown in FIG. 5; voltage $V_B$ being approximately equal to the reverse breakdown voltage of the junction 7.

The theoretical reasoning underlying the characteristics obtained is as follows: If the terminal 10 has a positive potential applied thereto with respect to terminal 10′, current will flow between the two. Since, however, the regions 3 and 6 are separated by the pn junction 7, current will flow substantially through the region 3, if the current is small. The voltage drop will occur mostly in the portion of region 3 under the region 6 this portion being narrower than the rest of the region 3. As soon as the voltage drop exceeds the reverse breakdown voltage of the junction 7, the junction 7 is substantially short-circuited as to the excess, and the current will flow through the region 6 in addition to the region 3. Because the resistance of the region 6 is very low, the resistance between the terminals 10 and 10' becomes dependently low to a voltage in excess of the reverse breakdown voltage $V_B$ of the junction 7 (as shown in FIG. 5). Needless to say, the same is true when the terminal 10' is made positive and the terminal 10 negative.

When the mesa structure shown in FIG. 1(*g*) is 0.2 mm. x 1.0 mm. and the phosphorus diffused portion 6 is 0.2 mm. x 0.6 mm., the current corresponding to a $V_B$ of 6.5 v. is 1.4 mA. $V_B$ may be varied by varying the surface concentration of the gallium diffused layer, and the resistance at voltage below $V_B$ may be controlled mainly by controlling the width between the junctions 7 and 4.

It is characteristic of the present invention that by selecting a proper $V_B$ the device may protect a coupled element from an excess voltage. This characteristic is not of course obtainable with a conventional resistor without destroying the resistor.

FIGS. 2(*a*) through 2(*g*) show an element of similar characteristics to that of FIG. 1, wherein the two pn junctions are surface stabilized by a covering oxide layer. After first forming an oxide layer 2 on an n-type silicon wafer, an opening 5 is effected in the oxide as shown in FIG. 2(*a*) (a plan view being shown in FIG. 2(*a'*)). Through the opening a boron diffused layer 3 is formed, as shown in FIG. 2(*b*). A new oxide film 11 is now grown on the region 3. A portion of the oxide film 11 is removed and a phosphorous diffused layer 6 is formed through that portion, as shown in the cross sectional view of FIG. 2(*c*) and the plan view of FIG. 2(*c'*). The surface concentration of the phosphorous diffused layer must again be higher than that of the boron diffused layer.

Subsequently predetermined portions 13 of the oxide layer are removed, as shown in FIG. 2(*d*), so that aluminum electrodes 8 may be deposited as shown in FIGS. 2(*e*) and 2(*e'*). As a last step lead wires 10 and 10' are attached and the wafer, if desired, separated into the units shown in FIGS. 2(*f*) and 2(g). The characteristics of this device are as mentioned similar to those of the device of FIG. 1, and FIG. 5 likewise applies.

FIGS. 3(*a*) and 3(*b*) and 4(*a*) and 4(*b*) show a second embodiment of the present invention. FIGS. 3(*a*) and 3(*b*) show an n-type silicon piece having boron selectively diffused by virtue of the oxide film technique previously disclosed, and FIGS. 4(*a*) and 4(*b*) show a similar element whose surface is stabilized. The characteristics of these elements are similar to those of the first embodiment, however, it is somewhat easier to obtain a high reverse breakdown voltage with the last described arrangement.

At this juncture, it bears mentioning that an element with the p-type and n-type regions reversed has similar characteristics, as long as the surface concentration of the second diffused layer is higher than that of the first diffused layer.

FIGS. 6(*a*) and 6(*b*) show a more sophisticated embodiment of the present invention with highly desirable characteristics. In this embodiment an n-type diffused layer 14 having a higher impurity concentration than the n-type silicon substrate 1 is formed in the latter by diffusing n-type impurities into an extremely thin region of the substrate 1 near the surface. Two p-type diffused layers 3 are then formed within the substrate 1, one through the region 14 and the other adjacent to the region 14. A terminal 10 is attached to the left end of the substrate 1 and another terminal 10' to the right end of the diffused layer 14; the two diffused layers 3 being situated therebetween. The voltage-current characteristics of the terminals 10 and 10' are as shown in FIG. 7.

The underlying theory is as follows: Letting the reverse breakdown voltage of the junction 4' on the left be $V_{B2}$, the following inequality holds:

$$V_{B2}>V_{B1}$$

Assuming the resistances $R_1$ and $R_2$ of the layers 15 and 16 (disposed under the p-type layers 3) are approximately equal to each other and are the same right to left and left to right in FIG. 8(*a*), and assuming for simplicity the remaining resistances are negligibly small, the resistance between the terminals 10 and 10' is $R_1+R_2$ until the current through the terminals 10 and 10' increases to $I_1$ where:

$$I_1R_1=V_{B1}$$

When the current through the terminals 10 and 10' exceeds $I_1$, breakdown is achieved and the resistance $R_1$ is substantially short-circulated for the excess current, as described in conjunction with the first embodiment, and hence the resistance between the terminals 10 and 10' is $R_2$ for the excess current until the current increases to $I_2$ where:

$$I_2R_2=V_{B2}$$

When the current exceeds $I_2$, the resistance $R_2$ is substantially short-circuited for the excess current and the device exhibits the characteristic as shown in FIG. 7. Needless to say, the characteristic is symmetrical in both polarities of the terminals 10 and 10'.

FIGS. 8(*a*) and 8(*b*) show a fourth embodiment in which the n-type diffused layer 14 has its left end within one of the p-type diffused layers 3 rather than totally including the p-type diffused layer as shown in FIG. 6. With such an arrangement the characteristics for a reversal in polarities at the terminals 10 and 10' are asymmetrical; the characteristic for one polarity being the same as that shown in FIG. 7.

By iterating the technique described in conjunction with FIGS. 6 and 8, and varying the breakdown voltages of the serial junctions, a controlled variable resistance over a wide range may be obtained, the characteristics of which may be as shown in FIG. 9. It is one of the significant features of the present invention that the characteristics may be made either symmetrical or asymmetrical with respect to the polarities of the terminals 10 and 10'.

The common characteristics of the above embodiments may be summarized as a discontinuous variation of a differential resistance ($\Delta R=\Delta V/\Delta I$) at a voltage and current which are controlled by the reverse breakdown voltage of a junction or two junctions, the discontinuity of differential resistance occurring at single or plural voltages and being symmetrical or asymmetrical with respect to the polarities of the two terminals.

While I have described the principles of my invention with respect to specific semiconductor materials, conductivity types, and processes, it is to be clearly understood that this description is made only by way of example and not as a limitation on the scope of my invention as set forth in the accompanying claims.

I claim:

1. A semiconductor device comprising at least two U-shaped PN junctions in parallel-spaced relationship extending from the same surface of said device, a pair of terminals only, disposed to include said junctions therebetween; semiconductor material of the first type filling the interior of said U's; semiconductor material of the second type embracing the periphery of said U's and contacting said terminals; a surface concentration of semiconductor material of the second type and of higher impurity concentration than said semiconductor material of the second type disposed to include the whole of the surface of the first type semiconductor material within at least one, but less than all, of said U-shaped junctions and the nearest proximity terminal.

2. A semiconductor device comprising at least two U-shaped PN junctions in parallel-spaced relationship extending from the same surface of said device, a pair of terminals only, disposed to include said junctions therebetween; semiconductor material of the first type filling the interior of said U's; semiconductor material of the second type embracing the periphery of said U's and contacting said terminals; a surface concentration of semiconductor material of the second type and of higher impurity concenrtation than said semiconductor material of the second type disposed to include a portion of the surface of the first type semiconductor material within at least one, but less than all, of said U-shaped junctions and the nearest proximity terminal.

References Cited

UNITED STATES PATENTS

| | | | |
|---|---|---|---|
| 2,869,055 | 1/1959 | Noyce | 317—235 |
| 2,954,486 | 9/1960 | Doucette et al. | 317—235 |
| 2,989,713 | 6/1961 | Warner | 317—234 X |
| 3,025,589 | 3/1962 | Hoerni | 29—25.3 |
| 3,134,912 | 5/1964 | Evans | 307—88.5 |
| 3,176,153 | 3/1965 | Bejat et al. | 317—235 |
| 3,183,128 | 5/1965 | Leistiko et al. | 317—235 |
| 3,183,129 | 5/1965 | Tripp | 317—235 |
| 3,210,677 | 10/1965 | Lin et al. | 330—17 |
| 3,230,398 | 1/1966 | Evans et al. | 317—235 X |
| 3,242,394 | 3/1966 | Biard | 317—235 |

JOHN W. HUCKERT, *Primary Examiner.*

A. M. LESNIAK, *Examiner.*